(12) United States Patent
Kasai et al.

(10) Patent No.: US 7,969,066 B2
(45) Date of Patent: Jun. 28, 2011

(54) MULTILAYER PEIEZOELECTRIC ACTUATOR HAVING A STRESS-ABSORBING EXTERNAL-ELECTRODE MEMBER WITH PORTIONS THEREOF NOT BONDED TO A BASE ELECTRODE

(75) Inventors: Shigeharu Kasai, Yasu (JP); Satoshi Shindou, Ritto (JP); Koichi Hayashi, Kusatsu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 12/894,263

(22) Filed: Sep. 30, 2010

(65) Prior Publication Data
US 2011/0018401 A1    Jan. 27, 2011

Related U.S. Application Data

(63) Continuation of application No. PCT/JP2009/001480, filed on Mar. 31, 2009.

(30) Foreign Application Priority Data

Apr. 11, 2008    (JP) .................................. 2008-103172

(51) Int. Cl.
*H01L 41/083* (2006.01)
(52) U.S. Cl. ......... 310/328; 310/364; 310/365; 310/366
(58) Field of Classification Search .................. 310/328, 310/363–366
See application file for complete search history.

(56) References Cited

U.S. PATENT DOCUMENTS

| 6,208,026 | B1 | 3/2001 | Bindig et al. | |
|---|---|---|---|---|
| 6,411,018 | B1 * | 6/2002 | Heinz | 310/363 |
| 6,507,140 | B1 * | 1/2003 | Heinz et al. | 310/366 |
| 6,522,052 | B2 * | 2/2003 | Kihara et al. | 310/366 |
| 6,700,306 | B2 * | 3/2004 | Nakamura et al. | 310/328 |
| 6,794,800 | B1 | 9/2004 | Heinz | |
| 7,439,655 | B2 * | 10/2008 | Asano et al. | 310/328 |
| 7,538,475 | B2 * | 5/2009 | Ohmori et al. | 310/328 |
| 7,554,250 | B2 * | 6/2009 | Kadotani et al. | 310/365 |
| 7,679,273 | B2 * | 3/2010 | Oakley et al. | 310/365 |
| 7,777,398 | B2 * | 8/2010 | Takei et al. | 310/365 |
| 7,851,979 | B2 | 12/2010 | Kronberger | |
| 2006/0022558 | A1 * | 2/2006 | Bindig et al. | 310/366 |

(Continued)

FOREIGN PATENT DOCUMENTS

DE    10 2004 015 574    11/2004
(Continued)

OTHER PUBLICATIONS

PCT/JP2009/001480 Written Opinion dated Apr. 17, 2009.

*Primary Examiner* — J. SanMartin
(74) *Attorney, Agent, or Firm* — Dickstein Shapiro LLP (57) ABSTRACT

In a multilayer piezoelectric actuator, external electrodes are formed on external surfaces of a multilayer piezoelectric body in which a plurality of internal electrodes and a plurality of piezoelectric layers are stacked on top of one another. Each of the external electrodes includes a base electrode and a stress-absorbing external-electrode member formed on the base electrode. The stress-absorbing external-electrode member is provided with an elastically deformable elastic structure, and a planar portion, which is continuous with the elastic structure and has at least an area sufficient for bonding a feeder terminal such as a lead line thereto.

7 Claims, 3 Drawing Sheets

U.S. PATENT DOCUMENTS

2010/0230622 A1 * 9/2010 Boecking ................ 251/129.06

FOREIGN PATENT DOCUMENTS

| DE | 10 2006 006 077 A1 | 8/2007 |
| EP | 1 753 039 A1 | 2/2007 |
| JP | 63-153870 A | 6/1988 |
| JP | 10-229227 A | 8/1998 |
| JP | 2002-61551 | 2/2002 |
| JP | 2002-542630 | 12/2002 |
| JP | 2003-210884 A | 7/2003 |
| JP | 2004/319967 A | 11/2004 |
| JP | 2006-303044 A | 11/2006 |
| JP | 2007-165394 A | 6/2007 |
| WO | WO-2007014002 | 10/2007 |

* cited by examiner

MULTILAYER PEIEZOELECTRIC ACTUATOR HAVING A STRESS-ABSORBING EXTERNAL-ELECTRODE MEMBER WITH PORTIONS THEREOF NOT BONDED TO A BASE ELECTRODE

CROSS REFERENCE TO RELATED APPLICATIONS

The present application is a continuation of International Application No. PCT/JP2009/001480, filed Mar. 31, 2009, which claims priority to Japanese Patent Application No. JP2008-103172, filed Apr. 11, 2008, the entire contents of each of these applications being incorporated herein by reference in their entirety.

FIELD OF THE INVENTION

The present invention relates to multilayer piezoelectric actuators used as, for example, driving sources for driving fuel-injection devices of diesel engines or the like and more specifically relates to multilayer piezoelectric actuators in which external electrodes formed on external surfaces of a multilayer piezoelectric body thereof each include a stress-absorbing external-electrode member that relaxes stress arising due to lengthening of the multilayer piezoelectric body.

BACKGROUND OF THE INVENTION

With multilayer piezoelectric actuators, a large displacement can be obtained but a large stress also arises in the multilayer piezoelectric body thereof. A multilayer piezoelectric actuator includes an active portion in which first and second internal electrodes, which are connected to different potentials, are stacked in a plurality of layers with piezoelectric layers therebetween; and a non-active portion positioned outside the active portion in the stacking direction. When driving is performed, a voltage is not applied to the piezoelectric layers of the non-active portion. Therefore, when driving is performed, a large stress arises between the active portion, which lengthens due to the piezoelectric effect, and the non-active portion and cracks sometimes occur in the piezoelectric body.

Figure 6:
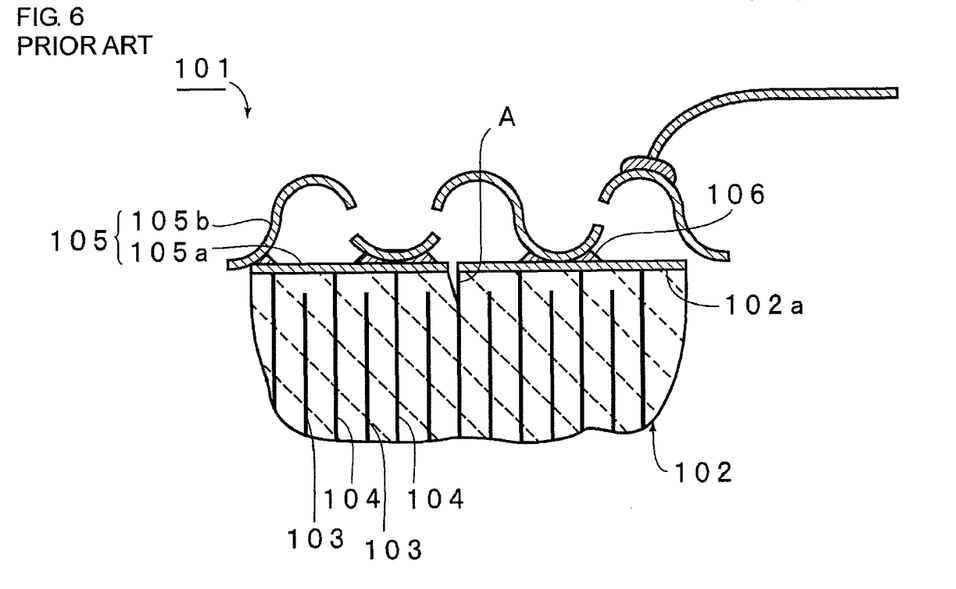
FIG. 6 is a partial cut-away front sectional view illustrating an example of a conventional multilayer piezoelectric actuator.

If such cracks progress and reach an external electrode, there is a risk of the external electrode formed on the surface of the multilayer piezoelectric body splitting. Accordingly, in order to prevent the external electrode from splitting, to date, a variety of structures have been proposed. For example, a multilayer piezoelectric actuator illustrated in FIG. 6 is disclosed in below-listed Patent Document 1. As illustrated in FIG. 6, in a multilayer piezoelectric actuator 101, a plurality of first internal electrodes 103 and a plurality of second internal electrodes 104 are alternately stacked on top of one another with piezoelectric layers therebetween in a multilayer piezoelectric body 102. The second internal electrodes 104 are led out to a side surface 102a. An external electrode 105 is formed so as to cover the side surface 102a. The external electrode 105 includes a metal base covering layer 105a formed on the side surface 102a, and an electrode member 105b that has a three-dimensional structure and is arranged on the metal base covering layer 105a. The electrode member 105b is bonded to the metal base covering layer 105a at a plurality of contact portions through conductive bonding members 106.

Even when a crack A occurs in the multilayer piezoelectric body 102 and the crack A reaches the side surface 102a, thereby splitting the metal base covering layer 105a, conduction is ensured by the electrode member 105b having a three-dimensional structure. Furthermore, the electrode member 105b, which has a three-dimensional structure, can absorb stress in the case where stress has arisen causing the crack A. Therefore, the electrode member 105b is not likely to split.

In Patent Document 1, such an electrode member 105b having a three-dimensional structure is not limited to having the shape illustrated in FIG. 6 and structures that employ a sponge metal or a metal mesh are also illustrated.

On the other hand, in below-listed Patent Document 2 and Patent Document 3, it is disclosed that a reinforcement external-electrode member, which is composed of a metal mesh, is stacked on a base electrode in a multilayer piezoelectric actuator.

[Patent Document 1] Japanese Unexamined Patent Application Publication No. 10-229227
[Patent Document 2] Japanese Unexamined Patent Application Publication No. 63-153870
[Patent Document 3] Japanese Unexamined Patent Application Publication No. 2003-210884

As described above, a variety of external electrodes have been proposed that have a structure that absorbs stress from a multilayer piezoelectric body.

On the other hand, feeder terminals such as lead lines are bonded to the external electrodes of the multilayer piezoelectric body in order to apply a voltage for driving the multilayer piezoelectric actuator. The feeder terminals are bonded to the external electrodes by soldering, silver brazing or the like. Therefore, the bonded portions between the feeder terminals and the external electrodes do not possess elasticity. Consequently, there has been a risk of the feeder terminals becoming detached when a stress from the above-described multilayer piezoelectric body acts on the bonded portions. If the feeder terminals become detached from the external electrodes, the multilayer piezoelectric actuator can no longer be driven.

In particular, when high-speed driving is demanded, for example in the case where the multilayer piezoelectric actuator is used as a driving source for a diesel-engine fuel-injection device, it is strongly desired that the feeder terminals be securely bonded to the external electrodes. However, although to date it has been possible to design multilayer piezoelectric actuators to produce an increased displacement while being of reduced size, it has been difficult to sufficiently increase the bonding strength of the external electrodes and the feeder terminals.

SUMMARY OF THE INVENTION

An object of the present invention is solve the above-described drawbacks of the background art and to provide a multilayer piezoelectric actuator that has a structure with which not only is it not likely that an external electrode thereof will split due to stress caused by a crack or the like but also with which the bonding strength of feeder terminals such as lead lines can be increased.

A multilayer piezoelectric actuator according to the present invention includes a multilayer piezoelectric body in which a plurality of internal electrodes and a plurality of piezoelectric layers are stacked on top of one another and in which the plurality of internal electrodes includes a first internal electrode and a second internal electrode connected to different potentials; and first and second external electrodes that are respectively electrically connected to the first and second internal electrodes and formed on external surfaces of multilayer piezoelectric body. The first and second external electrodes each include a base electrode formed on the external surface of the multilayer piezoelectric body and a stress-absorbing external-electrode member provided on the outside of the base electrode. The stress-absorbing external-electrode member includes an elastic structure that is formed on the base electrode and that elastically deforms when subject to an external force, and a planar portion that is continuous with the elastic structure and that has at least an area to which a feeder terminal to be bonded to the first or second external electrode can be bonded.

In a certain specific aspect of the multilayer piezoelectric actuator according to the present invention, the planar portion, to which the feeder terminal is connected, is not bonded to the base electrode and a portion of the part of the stress-absorbing external-electrode member other than the planar portion is fixed to the base electrode. Since the planar portion is not bonded to the base electrode, even when a feeder terminal such as a lead line is bonded to the planar portion, it is unlikely that stress will be transferred to the planar portion from the multilayer piezoelectric body. Therefore, it is unlikely that the feeder terminal will become detached from the planar portion of the stress-absorbing external-electrode member.

Furthermore, in another specific aspect of the multilayer piezoelectric actuator according to the present invention, the stress-absorbing external-electrode member is further provided with a fixed portion bonded to a part of the base electrode other than the elastic structure and the planar portion and is bonded to the base electrode at the fixed portion. Therefore, since neither the planar portion nor the elastic structure is bonded to the base electrode, stress arising from the multilayer piezoelectric body side can be effectively absorbed by the elastic structure and therefore a split is unlikely to occur in the stress-absorbing external-electrode member. Furthermore, since the stress is unlikely to be transferred to the planar portion, detachment of the feeder terminal from the planar portion is also unlikely to occur.

In yet another specific aspect of the present invention, the planar portion of the stress-absorbing external-electrode member is provided on a side of an end portion at which the multilayer piezoelectric actuator is fixed in place when in use. The multilayer piezoelectric actuator according to the present invention is suitably used for example in a fuel-injection device. When the multilayer piezoelectric actuator according to the present invention is used in a fuel-injection device, the multilayer piezoelectric actuator is usually fixed in place at just one end thereof. Therefore, as described above, the planar portion of the external-electrode member, to which the feeder terminal is connected, is connected to a side of the end portion at which the multilayer piezoelectric actuator is fixed in place when in use and thereby detachment of the feeder terminal is prevented since the accumulated displacement thereof is reduced.

In the multilayer piezoelectric actuator according to the present invention, the external electrodes each include a base electrode and a stress-absorbing external-electrode member formed on the base electrode. The stress-absorbing external-electrode member includes an elastic structure, which elastically deforms when subject to an external force, and a planar portion, to which a feeder terminal such as a lead line is bonded. Therefore, a stress that arises is effectively absorbed by the elastic deformation of the elastic structure and it is not likely that the stress will be transferred to the planar portion. Therefore, even during repeated use or when in use for a long period of time, it is not likely that splits will occur in the external electrodes. Furthermore, it is also not likely that detachment of for example the feeder terminals such as lead lines from the external electrodes will occur.

REFERENCE NUMERALS

1 . . . multilayer piezoelectric actuator
2 . . . multilayer piezoelectric body
2a . . . piezoelectric layer
2b, 2c . . . second side surface
2d . . . top surface
2e . . . bottom surface
2f . . . front surface
2g . . . back surface
3 to 5 . . . first internal electrode
7, 8 . . . second internal electrode
9 . . . external electrode
10 . . . base electrode
11 . . . stress-absorbing external-electrode member
11a . . . elastic structure
11b, 11c . . . fixed portion
11d . . . planar portion
21, 22 . . . insert metal layer
31a . . . elastic structure
31b, 31c . . . fixed portion
32, 33 . . . conductive bonding member
41a . . . elastic structure
41b, 41c . . . fixed portion
42, 43 . . . conductive bonding member

DETAILED DESCRIPTION OF THE INVENTION

Hereafter, the present invention will be made clear by describing specific embodiments of the present invention with reference to the drawings.

Figure 1A:
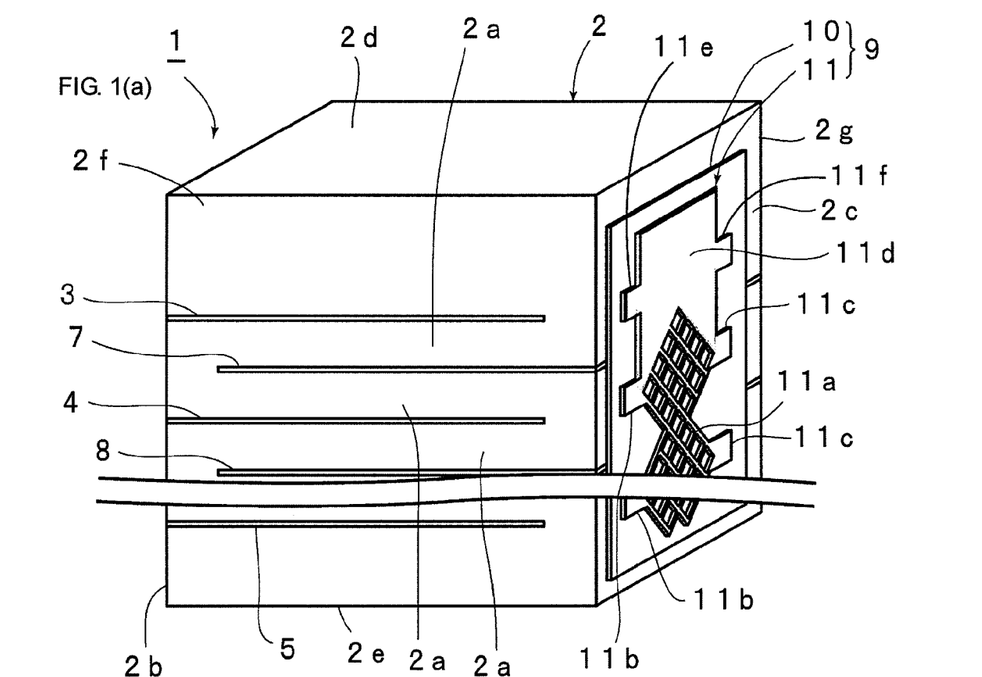
FIGS. 1(a) and 1(b) are respectively a perspective view and a right side surface view illustrating the exterior of a multilayer piezoelectric actuator according to a first embodiment of the present invention.
Figure 1B:
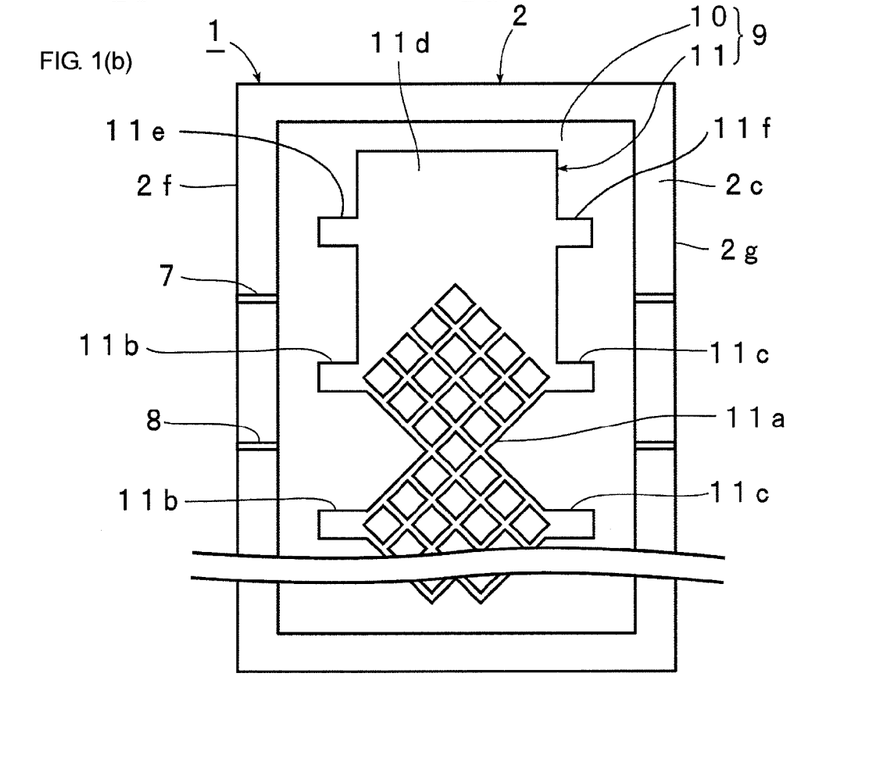

FIG. 1(a) and FIG. 1(b) are respectively a perspective view and a schematic right side surface view illustrating the exterior of a multilayer piezoelectric actuator according to an embodiment of the present invention.

A multilayer piezoelectric actuator 1 includes a multilayer piezoelectric body 2. The multilayer piezoelectric body 2 is a monolithic piezoelectric body obtained by firing internal electrodes and piezoelectric ceramic layers by using a co-firing technique.

In more detail, in the multilayer piezoelectric body 2, a plurality of first internal electrodes 3 to 5, which are connected to one potential, and second internal electrodes 7 and 8, which are connected to another potential different from that of the first internal electrodes, are alternately arranged in the stacking direction. The first internal electrodes 3 to 5 and the second internal electrodes 7 and 8 are arranged so as to overlap one another with piezoelectric layers 2a therebetween. In the multilayer piezoelectric body 2, the piezoelectric layers 2a are polarized in the thickness direction.

The first internal electrodes 3 to 5 are led out to a first side surface 2b of the multilayer piezoelectric body 2. In contrast, the plurality of second internal electrodes 7 and 8 are led out to a second side surface 2c, which is on the side opposite to the first side surface 2b.

An appropriate piezoelectric ceramic can be used as the piezoelectric material forming the multilayer piezoelectric body 2. Furthermore, the internal electrodes 3 to 5 and 7 and 8 are formed by co-sintering a conductive paste, such as Ag or Ag—Pd paste, and the ceramic.

The multilayer piezoelectric body 2 has a rectangular parallelepiped shape having the first and second side surfaces 2b and 2c, a top surface 2d and a bottom surface 2e, and a front surface 2f and a back surface 2g. A first external electrode is formed so as to be electrically connected to internal electrode edge portions of the first internal electrodes 3 to 5 led out to the side surface 2b. The first external electrode is not illustrated in FIG. 1(a).

Furthermore, a second external electrode 9 is formed on the second side surface 2c. The second external electrode 9 is electrically connected to internal electrode edge portions of the second internal electrodes 7 and 8 led out to the side surface 2c.

The first external electrode has the same structure as the second external electrode 9 and therefore the second external electrode 9 will be described as a representative example.

The second external electrode 9 includes a base electrode 10 composed of a metal film formed on the side surface 2c and a stress-absorbing external-electrode member 11 bonded to an external surface of the base electrode 10.

The base electrode 10 can be formed by using a suitable metal such as Ag or Ag—Pd. In this embodiment, the base electrode 10 is formed by applying and then baking a conductive paste including the metal. However, the base electrode 10 may instead be formed by using a thin-film forming method such as vapor deposition, plating or sputtering.

Figure 2:
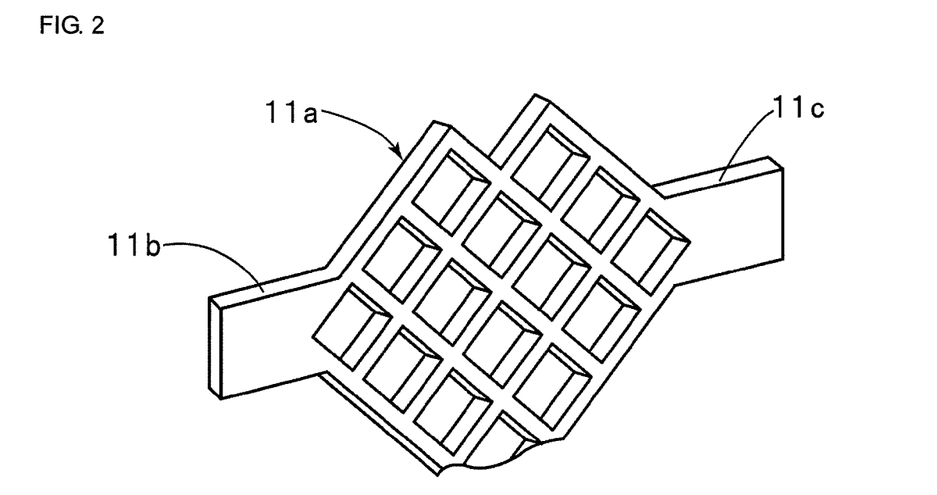
FIG. 2 is a partial cut-away perspective view for explaining the shape of an elastic structure of a stress-absorbing external-electrode member of the multilayer piezoelectric actuator according to the first embodiment.

The stress-absorbing external-electrode member 11 includes an elastic structure 11a that elastically deforms when subject to an external force, a plurality of sets of first and second fixed portions 11b and 11c, and a planar potion 11d. As illustrated in FIG. 2, in this embodiment, the elastic structure 11a has a metal mesh-like shape. Therefore, even when a stress occurs in the multilayer piezoelectric body 2 in the stacking direction or a direction that intersects the stacking direction, the metal mesh-shaped portion readily elastically deforms. Thus, even when driving is repeatedly performed or heat shock arises, it is not likely that the elastic structure 11a will split.

In contrast, the first and second fixed portions 11b and 11c are arranged so as to oppose each other with the elastic structure 11a therebetween. The first and second fixed portions 11b and 11c are bonded to the base electrode 10. The bonding structure will be described later.

The elastic structure 11a is not bonded to the outer surface of the base electrode 10. Therefore, the elastic structure 11a readily elastically deforms and absorbs a stress that has arisen. However, a portion of or the entirety of the elastic structure 11a may be bonded to the base electrode 10. In this case, the stress-absorbing action of the elastic structure 11a is reduced but splits are still less likely to occur than in the case where the elastic structure 11a is not provided.

In addition, just one of the first and second fixed portions 11b and 11c may be provided instead. In addition, rather than provide the first and second fixed portions 11b and 11c, a portion of the elastic structure 11a may instead be bonded and fixed to the base electrode 10.

On the other hand, the planar portion 11d is continuous with the top of the elastic structure 11a. The planar portion 11d is a planar-shaped portion having at least an area sufficient for bonding a feeder terminal such as a lead line thereto. Therefore, a feeder terminal such as a lead line can be easily and securely bonded to the external surface of the planar portion 11d by soldering, silver brazing or the like. Since the planar portion 11d to which the feeder terminal is bonded is provided separate from the elastic structure that elastically deforms upon receiving a stress, even when the elastic structure 11a deforms, it is unlikely that the feeder terminal will become detached from the planar portion 11d.

Furthermore, in this embodiment, first and second fixed portions 11e and 11f are provided so as to be continuous with the planar portion 11d. However, the planar portion 11d may be not bonded to the base electrode 10. In this case, even when stress is transferred to the base electrode 10 from the multilayer piezoelectric body 2, it is not likely that the stress will be transferred to the planar portion 11d from the base electrode 10. Thus, it is not likely that the feeder terminal will become detached from the planar portion 11d.

It is preferable that an end portion of the multilayer piezoelectric actuator 1 on the top surface 2d side be fixed in place during use. For example, in the case where the multilayer piezoelectric actuator 1 is used as an actuator in a fuel-injection device of an automobile, the multilayer piezoelectric actuator 1 is fixed in place only at a single end thereof. In this case, it is preferable that it be fixed in place at the top surface 2d side. Thus, since the cumulative displacement at the top surface 2d side is small compared with that at the bottom surface 2e side, the feeder terminal can be effectively prevented from becoming detached from the planar portion 11d.

In this embodiment, the first and second fixed portions 11b and 11c are bonded to the base electrode 10 through diffusion bonding. The base electrode 10 and the fixed portions 11b and 11c can be securely bonded to each other without performing heating at a particularly high temperature by using diffusion bonding.

Figure 3:
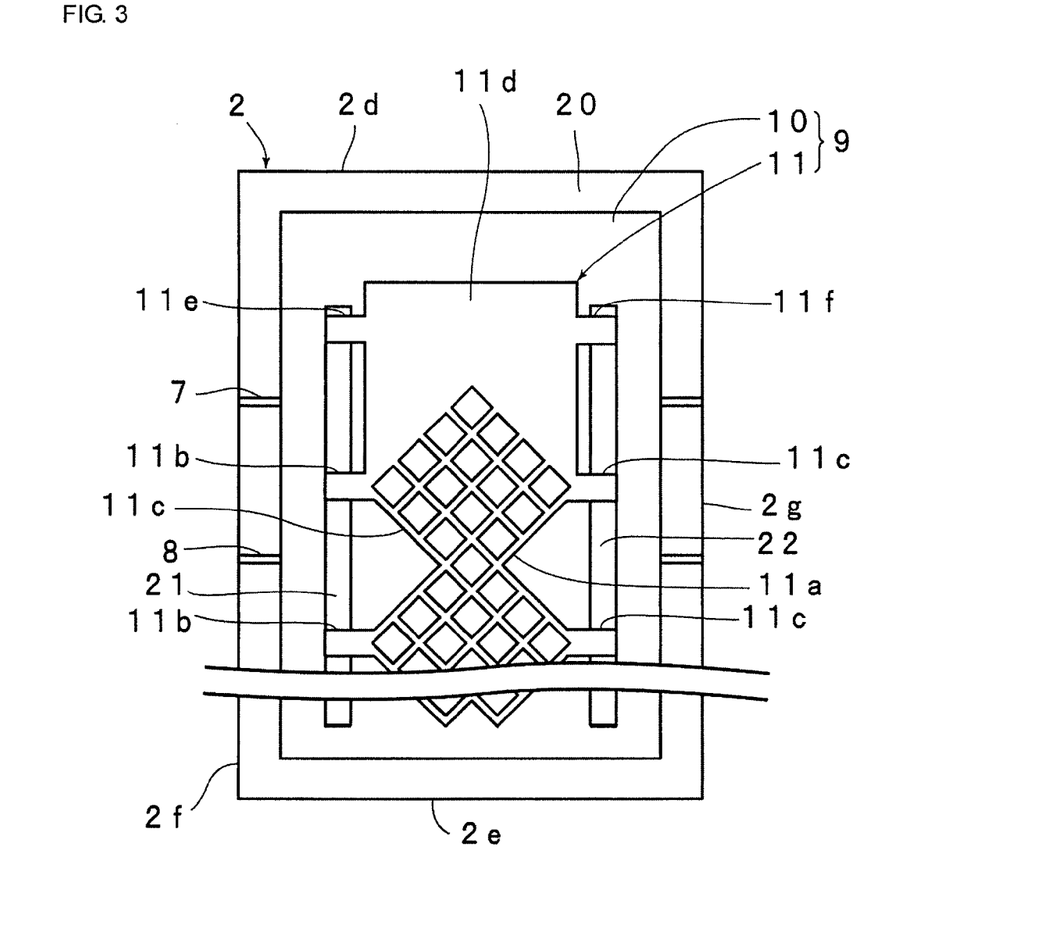
FIG. 3 is a right side surface view for explaining a modified example of the multilayer piezoelectric actuator according to the first embodiment.

In the case where diffusion bonding is used, bonding may be performed by arranging stripe-shaped insert metal layers 21 and 22 on the base electrode 10, as illustrated in the schematic right side surface view of FIG. 3. The insert metal layers 21 and 22 extend in the up/down direction so as to extend under the plurality of first fixed portions 11b and 11e or the plurality of second fixed portions 11c and 11f. The elastic structure 11a and the planar portion 11d are arranged between the pair of band-shaped insert metal layers 21 and 22. The insert metal layer 21 is arranged between the plurality of fixed portions 11b and 11e, and the base electrode 10, and the insert metal layer 22 is arranged between the plurality of second fixed portions 11c and 11f, and the base electrode 10, and then diffusion bonding is performed by carrying out heating in this state.

Therefore, the plurality of fixed portions 11b, 11c, 11e and 11f are securely bonded to the base electrode 10. In this case, since the insert metal layers 21 and 22 are provided, it is unlikely that the elastic structure 11a and the planar portion 11d, which are arranged between the insert metal layers 21 and 22, will closely contact the base electrode 10. Therefore, the stress-absorbing action of the elastic structure 11a is increased and furthermore it is less likely that stress will be transferred from the base electrode 10 side to the planar portion 11d.

Figure 4:
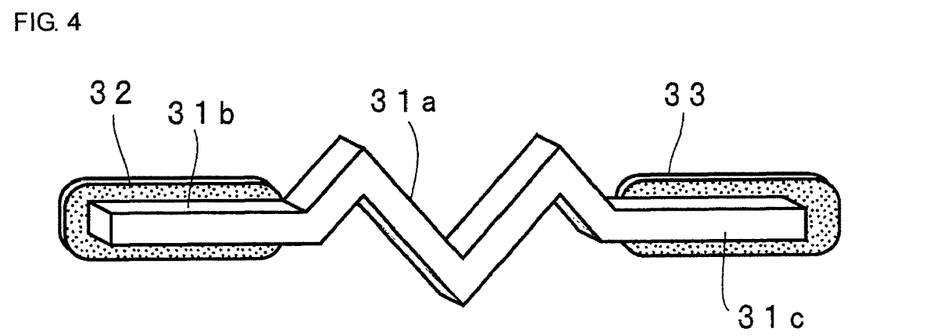
FIG. 4 is a perspective view for explaining a modified example of an elastic structure of the stress-absorbing external-electrode member.

In this embodiment, the elastic structure 11a has a mesh-like shape but so long as it is elastically deformed by a stress that has arisen and can absorb the stress, the elastic structure 11a that is used can have any of various shapes. For example, as illustrated in FIG. 4, a zig-zag-shaped elastic structure 31a, which has a plurality of bent portions, may be provided between first and second fixed portions 31b and 31c. The first and second fixed portions 31b and 31c are bonded onto the base electrode through conductive bonding members 32 and 33.

Figure 5:
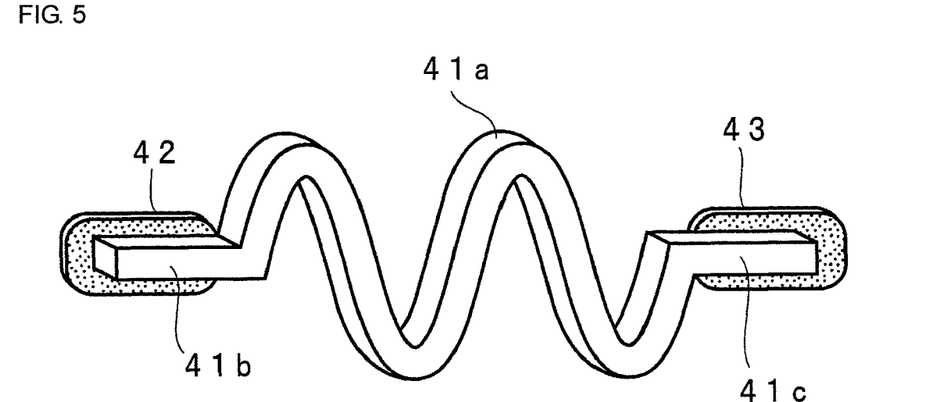
FIG. 5 is a perspective view for explaining another modified example of the elastic structure of the stress-absorbing external-electrode member.

Furthermore, as illustrated in FIG. 5, a meandering-shaped, that is, wave-shaped, elastic structure 41a may be arranged between first and second fixed portions 41b and 41c. The first and second fixed portions 41b and 41c are bonded to the base electrode through conductive bonding members 42 and 43.

FIG. 4 and FIG. 5 are views illustrating modified examples of the elastic structure. In this case, a plurality of rows of the zig-zag-shaped elastic structure 31a or the meandering-shaped elastic structure 41a may be formed between the first and second fixed portions.

Next, the fact that, with the multilayer piezoelectric actuator according to this embodiment, it is unlikely that the feeder terminals will become detached will be described on the basis of specific experimental examples.

First, a ceramic green sheet having a thickness of approximately 160 μm was formed using a ceramic slurry including a PZT piezoelectric ceramic powder, a resin binder and a plasticizer by employing a doctor blade method.

A conductive paste including Ag—Pd powder was printed onto one side of the ceramic green sheet. A plurality of the ceramic green sheets upon which the conductive paste had been printed were stacked on top of one another, and in addition a plurality of plain ceramic green sheets were stacked on both sides in the stacking direction. The obtained multilayer body was subjected to pressing and the ceramic green sheets were compression bonded together. The compression-bonded multilayer body was cut into portions the size of target multilayer piezoelectric bodies, and thereby multilayer chips were obtained. By heating, de-binder treating and firing each of the multilayer chips, the multilayer piezoelectric body 2 was obtained.

In the multilayer piezoelectric body 2, the distance between adjacent internal electrodes, that is, the thickness of a piezoelectric layer sandwiched between a pair of internal electrodes was made to be 100 μm. In this way, a 10 mm×10 mm multilayer piezoelectric body 2 with a dimension of 40 mm in the stacking direction was obtained.

Conductive paste having Ag as a main component was printed on the side surfaces 2b and 2c of the multilayer piezoelectric body 2. After being printed, the conductive paste was dried and then the same conductive paste was printed and dried to serve as insert metal layers for diffusion bonding. Next, each of the stress-absorbing external-electrode members was arranged. In this case, it was ensured that the elastic structure 11a did not contact the conductive paste forming the base electrode, such that the first and second fixed portions 11b and 11c and the planar portion 11d contacted the conductive paste forming the insert metal layers. Then, the conductive paste forming the insert metal layers was dried.

In addition, as the stress-absorbing external-electrode member 11, processing was performed to produce the shape illustrated in FIG. 1(b) by etching an iron-nickel alloy. After this processing, 5 to 10 μm of silver was formed on the surface by electroplating.

Next, the conductive paste was baked, thereby completing the base electrode 10, and the fixed portions 11b and 11c, between the base electrode 10 and the stress-absorbing external-electrode member 11 and the planar portion 11d were diffusion bonded.

The planar portion 11d had a rectangular shape with dimensions of a height of 2 mm and a width of 4 mm.

Lead lines composed of silicone rubber insulating flexible electric lines having a diameter of 1 mm were bonded to the planar portion 11d of the thus-obtained multilayer piezoelectric actuator by soldering.

As a second example, a multilayer piezoelectric actuator was obtained that was the same as that of the first example except that the area of the planar portion was 2 mm×2 mm and the planar portion was not bonded to the base electrode. In the multilayer piezoelectric actuator of the second example, similarly to as in the experimental example of the first example, lead lines composed of the same silicone rubber insulating flexible electric lines were attached by soldering.

For comparison, as a first comparative example, a multilayer piezoelectric actuator was manufactured in the same way as in the above examples except that a stress-absorbing external-electrode member was used in which the planar portion 11d was not provided and the elastic structure 11a extended into the region in which the planar portion 11d would have been provided. In the multilayer piezoelectric actuator of the first comparative example, the same lead lines as in the examples were bonded by soldering to portions of the elastic structures.

(Evaluation)

Five samples were prepared for each of the first, second examples, and the first comparative example and lead lines were bonded to each of the multilayer piezoelectric actuators. For each of the samples, driving using a rectangular wave of 0 V to 200 V in which 200 V was applied for 1 ms and then 0 V was applied for 3 ms, was repeatedly performed. The number of times driving was performed before breakdown was reached was obtained. In addition, the measurements were performed at 60° C. and at a relative humidity of 50% and under these driving conditions a current of substantially 10 A was generated from the multilayer piezoelectric actuator.

From the results, for the multilayer piezoelectric actuators of the comparative example, driving stopped for all of the five samples after driving had been performed $1 \times 10^8$ times or less.

In contrast, for the samples of the first example, even when driving had been performed $1 \times 10^9$ times or more, occurrence of breakdown was not recognized, and after driving had been performed $1.5 \times 10^9$ times, driving stopped in three out of the five samples. Furthermore, for the samples of the second example, even when all five of the samples had been driven $2 \times 10^9$ times or more, occurrence of breakdown was not recognized.

In other words, compared to the first comparative example, with the first example, it is thought that since the lead lines were securely bonded to the planar portion, the number of times driving was performed before breakdown was reached was markedly increased. Furthermore, in the second example, it is thought that since the planar portion was not bonded to the base electrode, it was less likely that the lead lines would become detached from the planar portions.

The invention claimed is:

1. A multilayer piezoelectric actuator comprising:
   a multilayer piezoelectric body in which a plurality of internal electrodes and a plurality of piezoelectric layers are stacked on top of one another, the plurality of internal electrodes including at least a first internal electrode and at least a second internal electrode connected to different potentials; and first and second external electrodes that are respectively electrically connected to the first and second internal electrodes and located on external surfaces of the multilayer piezoelectric body, wherein the first and second external electrodes each include a base electrode provided on the external surface of the multilayer piezoelectric body and a stress-absorbing external-electrode member provided on the base electrode, wherein the stress-absorbing external-electrode member includes an elastic structure on the base electrode that elastically deforms when subject to an external force, and a planar portion continuous with the elastic structure and having a feeder terminal bonding area, wherein the planar portion of the stress-absorbing external-electrode member is not bonded to the base electrode and a portion of the part of the stress-absorbing external-electrode member other than the planar portion is bonded onto the base electrode, and wherein the stress-absorbing external-electrode member further includes a fixed portion bonded to the base electrode and the planar portion and the elastic structure are not bonded to the base electrode.

2. The multilayer piezoelectric actuator according to claim 1, wherein the base electrode and the stress-absorbing external-electrode member are bonded to each other by diffusion bonding.

3. The multilayer piezoelectric actuator according to claim 1, wherein the planar portion of the stress-absorbing external-electrode member is provided on a side of an end portion at which the multilayer piezoelectric actuator is fixed in place when in use.

4. The multilayer piezoelectric actuator according to claim 1, wherein the piezoelectric layers are polarized in a thickness direction of the multilayer piezoelectric body.

5. The multilayer piezoelectric actuator according to claim 1, wherein the elastic structure has a mesh-like shape.

6. The multilayer piezoelectric actuator according to claim 1, wherein the elastic structure has a zig-zag shape.

7. The multilayer piezoelectric actuator according to claim 1, wherein the elastic structure has a meandering shape.

* * * * *

UNITED STATES PATENT AND TRADEMARK OFFICE
CERTIFICATE OF CORRECTION

PATENT NO. : 7,969,066 B2  
APPLICATION NO. : 12/894263  
DATED : June 28, 2011  
INVENTOR(S) : Shigeharu Kasai et al.

Page 1 of 1

It is certified that error appears in the above-identified patent and that said Letters Patent is hereby corrected as shown below:

Title page, Item (54)

Please correct the title to read MULTILAYER PIEZOELECTRIC ACTUATOR HAVING A STRESS-ABSORBING EXTERNAL-ELECTRODE MEMBER WITH PORTIONS THEREOF NOT BONDED TO A BASE ELECTRODE

In the Specification:

Correct the title at column 1, line number 1, delete "MULTILAYER PEIEZOELECTRIC" and add MULTILAYER PIEZOELECTRIC

Signed and Sealed this  
Twenty-seventh Day of September, 2011

David J. Kappos  
*Director of the United States Patent and Trademark Office*